(12) United States Patent
Dietl

(10) Patent No.: US 6,870,406 B2
(45) Date of Patent: Mar. 22, 2005

(54) OUTPUT DRIVER CIRCUIT

(75) Inventor: Markus Dietl, Munich (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/306,267

(22) Filed: Nov. 27, 2002

(65) Prior Publication Data

US 2004/0000933 A1 Jan. 1, 2004

(30) Foreign Application Priority Data

Nov. 27, 2001 (DE) .......................... 101 58 112

(51) Int. Cl.$^7$ ................................................. H03B 1/00
(52) U.S. Cl. ....................................... 327/108; 327/87
(58) Field of Search ...................... 327/108–112, 170, 327/379, 382, 387, 389, 391; 326/22, 23, 26, 27, 82, 83, 89

(56) References Cited

U.S. PATENT DOCUMENTS

| | | | | |
|---|---|---|---|---|
| 5,168,176 A | * | 12/1992 | Wanlass | 326/87 |
| 5,801,550 A | * | 9/1998 | Tanaka et al. | 326/87 |
| 6,271,699 B1 | * | 8/2001 | Dowlatabadi | 327/170 |

* cited by examiner

Primary Examiner—Long Nguyen
(74) Attorney, Agent, or Firm—W. Daniel Swayze, Jr.; W. James Brady; Frederick J. Telecky, Jr.

(57) ABSTRACT

An output driver circuit includes an input stage to which an input voltage is applied, and an output stage to which an output voltage is applied, input stage and output stage being connected by at least one supply voltage terminal and/or at least one ground terminal to which at least one parasitic inductance is applied, and the input stage and output stage being configured so that when the difference amount between a potential as a function of the input voltage and a potential as a function of the supply voltage and/or ground voltage exceeds a predefined first threshold value or drops below a predefined second threshold value a flow of current is activated or deactivated respectively in the output stage via the supply voltage terminal(s) and/or the ground terminal (s) which also flows via the parasitic inductance(s). The output driver circuit in includes in addition, a circuit element connected to the input voltage capable of "seeing" or determining whether the input voltage in a predefined interval hovers around a value corresponding to the first threshold value or second threshold value and that, if so, a control signal is generated with which changes in the flow of current in the output stage are reduced until the input voltage is outside of the predefined interval.

4 Claims, 1 Drawing Sheet

OUTPUT DRIVER CIRCUIT

FIELD OF THE INVENTION

The invention relates to an output circuit.

BACKGROUND OF THE INVENTION

Such output driver circuits are known from prior art e.g. as bus driver circuits. Output driver circuits as integrated circuits are required in general to reverse the charge of relatively high capacitances as may occur in conjunction with e.g. data and clock inputs. Reversing the charge of the high load capacitance at the output of driver circuits results in noise voltages in the bonding leads to the output driver forming the parasitic inductances which may become so high that a circuit failure occurs.

Referring now to FIG. 1, there is illustrated diagrammatically an output driver circuit including an input stage and an output stage to which respectively an input voltage $V_{in}$ and an output voltage $V_{out}$ is applied. Both the input stage and the output stage receive a supply voltage $V_{cc}$. The parasitic inductances of the terminal leads for the supply voltage and ground terminal are identified in FIG. 1 by $L_1$ and $L_2$ respectively. The terminal leads may be e.g. bonding leads.

Referring now to FIG. 2, there is illustrated the effect of the parasitic inductances on the supply voltage $V_{cc}$ and ground potential $V_{gnd}$ when a current is applied to the output of the output stage flowing via the $V_{cc}$ and GND terminals. Assuming now that a slowly increasing voltage, indicated by the broken line in FIG. 2, is applied to the terminal $V_{in}$ at the input stage and that the circuit is configured so that as soon as the input voltage $V_{in}$ applied to the input stage has achieved a value at which the difference amount between the input voltage $V_{in}$ and supply voltage $V_{cc}$ drops below a critical threshold $\Delta V_s$, a switching action is activated in the output stage, resulting in a load capacitance at the output of the output stage being charged via the supply voltage, then a high current flows from the $V_{cc}$ terminal via the parasitic inductance $L_1$, the output stage, the parasitic inductance $L_2$ and the ground terminal. It is due to these parasitic inductances that noise voltages materialize which cause a shift in the level of the supply voltage $V_{cc}$ and ground voltage $V_{gnd}$, illustrated in FIG. 2 by the two oscillations which pass through the supply voltage and the ground voltage. These oscillations cause a change in the ratio of the supply voltage to the input voltage such that the switching threshold $\Delta V_s$ for activating the output stage is again violated which may result in the flow of current in the output stage again being deactivated. This may result in e.g. a digital signal generated at the output of the output stage assuming a wrong value.

OBJECTS OF THE INVENTION

It is thus the objective of the invention to provide an output driver circuit in which the negative influence of the parasitic inductances on the response of the circuit is substantially diminished. This objective of the invention is achieved by an output driver circuit that includes a circuit element connected to the input voltage capable of "seeing" or determining whether the input voltage in a predefined interval hovers around a value corresponding to the first threshold value or second threshold value and that, if so, a control signal is generated with which changes in the flow of current in the output stage are reduced until the input voltage is outside of the predefined interval.

The effect of the circuit in accordance with the invention is based on it acting in the critical moments when the input voltage hovers around a value at which, otherwise, a heavy flow of current would be activated or deactivated in the output stage, such that it suppresses or diminishes changes in the flow of current in the output stage and thus the noise voltages caused thereby until the input voltage of the output driver circuit has assumed a safe spacing away from the value at which a heavy flow of current is activated or deactivated so that the influence of the noise voltages, even on heavy changes in the current in the output stage, is now no longer sufficient to provoke a faulty response of the circuit.

BRIEF DESCRIPTION OF THE DRAWINGS

Further features and advantages of the invention will now be explained by with reference to the drawings in which.

DETAILED DESCRIPTION OF THE DRAWINGS

Figure 3:
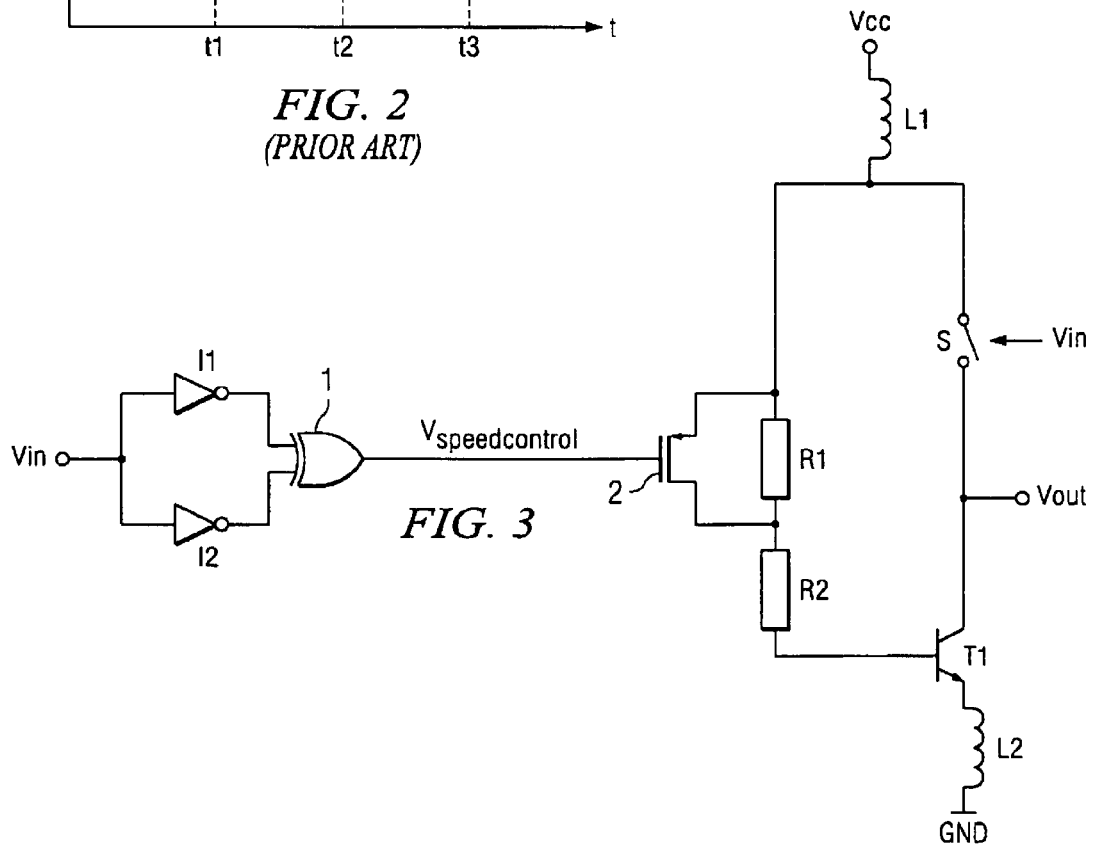
FIG. 3 is a circuit diagram of a preferred example embodiment of a circuit element substantial to the output driver circuit in accordance with the invention.

Referring now to FIG. 3, there is illustrated the circuit element including a first inverter I1 having a first switching threshold connected in parallel to a second inverter I2 having a second switching threshold which differs from the first switching threshold and in the present example is smaller than the first switching threshold. The first switching threshold of the first inverter is identified $V_{max}$ and the second threshold value of the second inverter is identified $V_{min}$.

The inputs of the two inverters are connected to the input voltage terminal of the input stage of the output driver circuit.

In this arrangement, the switching thresholds $V_{max}$ and $V_{min}$ are selected so that they form a predefined interval about a threshold value $\Delta V_s$ corresponding to a predefined difference between the supply voltage $V_{cc}$ and input voltage $V_{in}$, i.e.

$$V_{min} < \Delta V_s < V_{max}.$$

The circuit as shown in FIG. 3 further comprises an EXCLUSIVE OR gate 1 (XOR gate) which receives at its two inputs the output signals generated by the two inverters. At the output of the XOR gate a control signal $V_{speedcontrol}$ is generated for controlling the flow of current in the output stage.

Shown on the right-hand side of FIG. 3 is part of the circuit elements existing, for example, in an output stage. In this arrangement T1 identifies a bipolar output transistor for generating at the output $V_{out}$ of the output driver circuit a voltage via which e.g. a load capacitance at the output can be charged. However, transistor T1 may also consist of some other component such as e.g. a MOS-FET.

In the output stage a flow of current can be activated via the supply voltage $V_{cc}$, parasitic inductance L1, switch S, bipolar transistor T1, parasitic inductance L2 and ground when the switch S is closed. The switch S is a controllable switch which is controlled by the input voltage at the input stage of the output driver circuit and is turned on when the difference amount between the input voltage $V_{in}$ and supply voltage $V_{cc}$ exceeds a predefined threshold value.

Connected in series in the current path leading to the base of the transistor T1 are two resistors R1 and R2. Connected in parallel to the resistor R1 is the source/drain circuit of a MOS-FET 2 to the gate of which the control signal $V_{speed-control}$ is applied.

The function of the output driver circuit will now be described by way of example.

Figure 1:
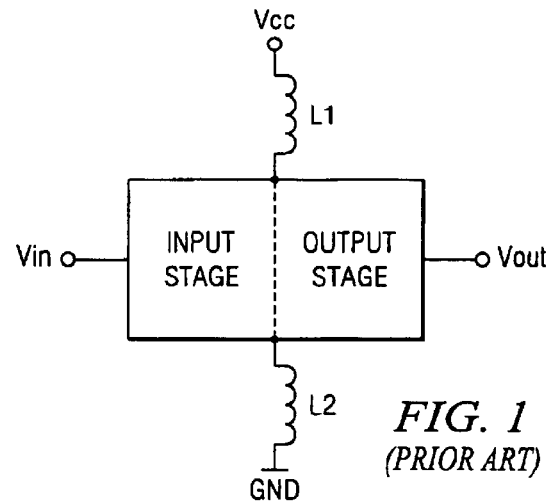
FIG. 1 is an equivalent circuit diagram of an output driver circuit including parasitic inductances.
Figure 2:
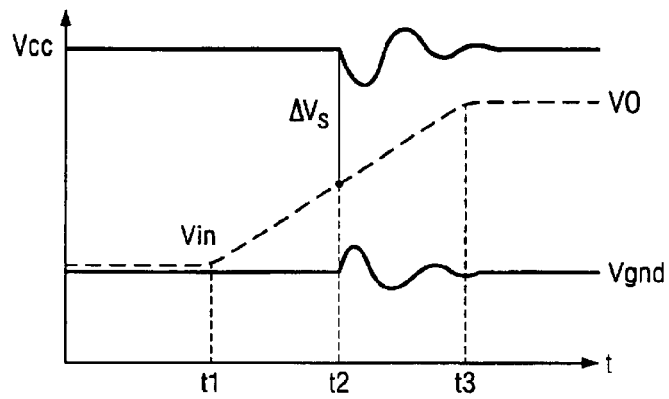
FIG. 2 is a graph depicting the noise voltages occurring in the output driver circuit as shown in FIG. 1.

Assuming now that at the input voltage terminal $V_{in}$ of the input stage of the output driver circuit in accordance with the invention (see FIG. 3) an initially slowly rising voltage signal is applied as is evident from the graph in FIG. 2 between the points in time $t_1$ and $t_2$, then as long as the input voltage $V_{in}$ is below the switching threshold $V_{min}$ of the second inverter I2, the XOR gate 1 produces no control signal $V_{speedcontrol}$ and MOS-FET 2 is turned on, so that via the source/drain circuit of the MOS-FET 2 a current flows parallel to the resistor R1 to the base of the transistor T1. However, as soon as the input voltage $V_{in}$ attains the switching threshold $V_{min}$ of the second inverter I2, this produces at the output a control signal which gains access to an input of the XOR gate and produces at the output of the XOR gate a control signal $V_{speedcontrol}$ which gains access to the gate of the MOS-FET 2, turning it off. This deactivates the flow of current via the source/drain circuit of the MOS-FET 2 and transistor T1 receives a reduced base current. When the input voltage $V_{in}$ at the point in time t2 then attains such a value that the difference amount between the supply voltage $V_{cc}$ and the input voltage $V_{in}$ exceeds a predefined threshold value $\Delta V_s$, then the switch S as shown in FIG. 3 is turned on and a current flows via $V_{cc}$, $L_1$; S, T1, $L_2$ and ground.

This flow of current is, however, relatively small, since the base of transistor T1 receives only a minor current which has to flow via the resistors R1 and R2. It is due to this minor flow of current that also only low noise voltages are produced by the parasitic inductances $L_1$ and $L_2$ so that the level of the supply voltage $V_{cc}$ and of the ground voltage Vo is shifted only relatively slightly. This results in the difference $\Delta V_s$ between the supply voltage and the input voltage remaining in a predefined tolerance range in thus avoiding a faulty response of the output driver circuit which e.g. could otherwise activate a reopening of the switch S. The control signal $V_{speedcontrol}$ and the low output current of the output stage of the output driver circuit associated therewith remain at this level until the input voltage $V_{in}$ has attained the potential $V_{max}$ corresponding to the switching threshold of the first inverter I1 which is higher than $\Delta V_s$. Once this switching threshold is attained, the first inverter I1 also produces an output signal which gains access to the input of the XOR gate so that at the output of the XOR gate a signal is output which gains access to the gate of the MOS-FET 2 which is then turned on. This now results in the base of transistor T1 receiving a higher control current so that the output current of the output stage of the output driver circuit flowing via $V_{cc}$, $L_1$, S, T1, $L_2$ and ground now attains its full value as needed to quickly charge a load capacitance at the output of the output stage.

It will be appreciated that $V_{max}$ and $V_{min}$ need to be selected at least so that a faulty response of the circuit due to the noise voltages is just avoided, however, reducing the speed of the output stage in charge reversal of a load capacitance at the output as little as possible.

In the above example, the current in the output stage was activated when the difference amount between the supply voltage and input voltage has attained a predefined threshold value. It is readily appreciate that it is not that the input voltage is related to the supply voltage, it being just as possible that the input voltage is compared to the ground voltage or to the supply voltage and the ground voltage or also to the difference between supply voltage and ground voltage.

It is understood that the example embodiment as shown in FIG. 3 can be modified, of course, in many ways without departing from the gist of the invention, it merely being important that the output driver circuit comprises a circuit element capable of "seeing" or determining whether the input voltage is hovering about a value corresponding to the threshold value in a predefined interval and that, if so, a control signal is produced with which changes in the current in the output stage continue to be reduced until the input voltage is outside of the predefined interval.

The circuit in accordance with the invention is particularly suitable for circuits in which slowly rising input signals occur.

What is claimed is:

1. An output driver circuit comprising:

an in put stage for recieving an input voltage;

an output stage providing an output voltage, said input stage and output stage being connected to a supply voltage terminal;

a ground terminal to which a parasitic inductance element is formed;

said input stage and output stage being configured so that when the difference amount between a potential as a function of said input voltage and a potential as a function of a supply voltage at the supply voltage terminal or a ground voltage at the ground terminal exceeds a predefined first threshold value or drops below a predefined second threshold value, a flow of current is activated or deactivated, respectively, in said output stage via said supply voltage terminal which also flows via said parasitic inductance element wherein input stage comprises a determining circuit connected to said input voltage to determine whether said input voltage in a predefined interval approximates a value corresponding to said first threshold value or second threshold value and that, if so, a control signal is generated which changes the flow of current in said output stage and is reduced until said input voltage is outside of said predefined interval.

2. The output driver circuit as in claim 1, wherein said determining comprises two inverters each receiving said input voltage having different switching threshold potentials corresponding to an upper limit and a lower limit of said interval, and a logic gate, an input of the logic gate is connected to the output of one of said inverters and which outputs the control signal at an output of said logic gate.

3. The output driver circuit as in claim 2, wherein said logic gate is a XOR gate.

4. The output driver as in claim 1, wherein said control signal is applied to the gate of a MOS-FET such that said flow of current in said output stage is controlled.

* * * * *